(12) United States Patent
Fleck et al.

(10) Patent No.: US 6,988,652 B2
(45) Date of Patent: Jan. 24, 2006

(54) SOLDER PRINTING USING A STENCIL HAVING A REVERSE-TAPERED APERTURE

(75) Inventors: Ian McPhee Fleck, Roswell, GA (US); Ron Tripp, Binghamton, NY (US); Prashant Chouta, Brookline, MA (US); Scott Craig, Duluth, GA (US)

(73) Assignee: Fry's Metals, Inc., Jersey City, NJ (US)

( * ) Notice: Subject to any disclaimer, the term of this patent is extended or adjusted under 35 U.S.C. 154(b) by 277 days.

(21) Appl. No.: 10/156,962

(22) Filed: May 29, 2002

(65) Prior Publication Data

US 2003/0222125 A1 Dec. 4, 2003

Related U.S. Application Data

(60) Provisional application No. 60/381,508, filed on May 17, 2002.

(51) Int. Cl.
*B23K 31/00* (2006.01)
*B23K 31/02* (2006.01)
*B23K 1/08* (2006.01)
*B23K 37/06* (2006.01)

(52) U.S. Cl. ............... 228/180.21; 228/39; 228/41; 228/180.22; 118/504; 118/721

(58) Field of Classification Search ............ 228/180.21, 228/180.22, 39–41, 245, 246, 248.1; 101/128.4; 118/504, 721
See application file for complete search history.

(56) References Cited

U.S. PATENT DOCUMENTS

| | | | | |
|---|---|---|---|---|
| 4,622,239 A | | 11/1986 | Schoenthaler et al. ........ 427/96 |
| 5,359,928 A | * | 11/1994 | Blessington et al. ...... 101/128.4 |
| 5,460,316 A | * | 10/1995 | Hefele ........................... 228/39 |
| 5,492,266 A | | 2/1996 | Hoebener et al. ......... 228/248.1 |
| 5,762,259 A | | 6/1998 | Hubachert et al. ..... 228/180.22 |
| 5,824,155 A | * | 10/1998 | Ha et al. ..................... 118/410 |
| 5,873,512 A | * | 2/1999 | Bielick et al. .............. 228/216 |
| 5,926,375 A | * | 7/1999 | Watanabe et al. ........... 361/760 |
| 6,273,327 B1 | * | 8/2001 | Murray et al. .............. 228/245 |
| 6,521,287 B2 | * | 2/2003 | Jiang et al. ................. 427/143 |
| 2001/0046586 A1 | * | 11/2001 | Chan et al. ................. 428/131 |
| 2002/0066523 A1 | * | 6/2002 | Sundstrom et al. ......... 156/229 |

OTHER PUBLICATIONS

Patent Abstract of Japan, vol. 016, No. 212(M–1250), May 19, 1992 and JP 04–035991 A (Fujitsu Ltd.) Feb. 6, 1992.

"Screen Stencils with Improved Release Properties", *IBM Technical Disclosure Bulletin*, IBM Corp. New York, U.S., 37(6A):441–442 (1994).

Database WPI Week 198619, Derwent Publications Ltd., London, GB, XP–002251325 and JP 61–063090 A (Hitachi Ltd.) Apr. 1, 1986.

International Search Report, mailing date: Sep. 4, 2003.

* cited by examiner

*Primary Examiner*—L. Edmondson
(74) *Attorney, Agent, or Firm*—Mintz, Levin, Cohn, Ferris, Glovsky and Popeo, P.C.

(57) ABSTRACT

A stencil used for printing solder paste on a contact pad of a printed wiring board has one or more reverse-tapered apertures passing there through, wherein the apertures have a variable cross-section that is larger at the fill side of the stencil (i.e., where solder paste enters the apertures) than at the board side of the stencil (i.e., where the stencil contacts the contact pad of the printed wiring board).

21 Claims, 1 Drawing Sheet

SOLDER PRINTING USING A STENCIL HAVING A REVERSE-TAPERED APERTURE

RELATED APPLICATION

Priority is claimed to U.S. Provisional Patent Application Ser. No. 60/381,508, filed May 17, 2002.

BACKGROUND

Electronic components are often mounted on a printed wiring board (also known as a "printed circuit board") via a process known as "surface-mount technology" (SMT). In SMT, the electrical components are soldered to pads on the surface of the printed wiring board instead of in plated holes drilled through the board, as in through-hole technology.

In a known technique for printing solder paste on a printed wiring board, and as shown in FIG. 1, a blade 12 (e.g., of a squeegee) pushes solder paste 14 along a fill side 16 of a stencil 18 and then through apertures in the stencil 18 and onto conductive contact pads 20 on a surface of the printed wiring board 22.

Conventional thinking in the stencil fabrication industry has held for years that the release of paste from a stencil aperture is enhanced if the aperture walls 24, 26 are tapered so that the aperture's widest opening is on the board side 28 of the stencil 18, while its narrowest opening is on the stencil's opposite, "fill" or "squeegee" side 16. Henceforth, this configuration, illustrated in FIG. 1, is referred to as an acute aperture taper.

In support of the case for creating the walls with an acute taper, careful measurements of the amount of material deposited during printing as a percentage of the aperture's theoretical volume shows an increase in the percentage of material that is deposited, at least to a degree, as the acuteness of the taper of the walls from the fill side to the board side of the stencil is increased.

Even more careful measurements have shown that this observed improvement in relative release efficiency is due to a simultaneous increase in the so-called area factor of the aperture, which is a consequence of the tapering process. "Area factor" is defined as the ratio of the area of the stencil aperture at the board side to the area of the aperture walls. The underlying physical theory is that transfer of paste to the pad is enhanced by having a large area of contact between the paste and pad; conversely, paste more readily adheres to the aperture walls in preference to the pads where there is a large contact area between the paste and the wall surfaces, and hence, a low area factor. However, this improvement may be offset because the taper forces the capillary force to work at an angle to the perpendicular.

SUMMARY

The methods described herein utilize a stencil having at least one aperture extending from a fill side to a board side and characterized in that the taper of the aperture is reversed from that of the conventional acute taper. Such a stencil is placed in contact with a printed wiring board with at least one aperture in the stencil aligned with a contact pad of the printed wiring board. Solder paste is then printed, in paste form, through the aperture—from a fill side of the stencil to a board side of the stencil—onto the contact pad. The solder paste adheres to the contact pad, and the stencil can then be removed. The stencil is particularly characterized in that the aperture is reverse tapered such that the cross-section of the aperture expands from the board side—where the aperture has a profile that fits within the profile of the surface of the contact pad—to the fill side.

These methods can increase the volume of solder deposited through the stencil onto the contact pad of a printed wiring board due to the design of the aperture(s) in the stencil. The aperture is designed to increase both the absolute volume of paste that can be filled into the aperture and the resultant absolute volume of paste released from the stencil for any given board-side opening without allowing any solder paste to extend beyond the surface of the contact pad so as to contaminate any other area of the printed wiring board surface.

Tapering the aperture to gradually increase its cross-section from the board side to the fill side of the stencil involves two opposing effects. The first effect is a decrease in area factor (i.e., the ratio of the area of the stencil opening on the board side to the area of the aperture walls), which generally would be expected to reduce relative paste-release efficiency and which would, in itself, would be an undesirable outcome. The other effect, however, is to increase total aperture volume, which acts in opposition to the reduced paste-release efficiency and promotes the desired end point of maximizing the volume of paste actually delivered to the solder pad. Though previous thinking was focused on maximizing the paste-release efficiency, actual, careful experiments have shown that the increase in total aperture volume achievable with a reverse (or obtuse) taper (i.e., where the cross-section of the aperture expands from the board side to the fill side of the stencil) can more than offset a drop in paste-release efficiency and provide an increase in total deposited paste volume over what would have been achieved with no taper (walls extending perpendicular to the board surface) or with a conventional, acute taper.

In addition to expanding the paste volume capacity within the aperture, use of the above-described reverse taper, wherein the aperture is filled from its larger orifice, enhances the filling action as solder paste is squeezed into the orifice, thereby further increasing the volume of solder paste available for deposit onto the contact pad.

Finally, another important reason why this technique works is that the reverse taper reduces capillary action in the aperture. Small apertures qualify by virtue of their small dimensions as capillaries and, as such, their tendency to resist paste release during the printing process can be viewed as being due to upward capillary forces. These forces diminish directly with increasing cross-sectional area of the aperture and, therefore, are inherently lessened as the average aperture cross-sectional area is increased. Because reverse tapering of the aperture walls increases the average cross-sectional area of the aperture, the reverse-tapered aperture offers an innovative means for reducing capillary action and increasing the volume of solder paste deposited through the board-side aperture opening not withstanding that the maximum cross-sectional area of the board-side opening is fixed by the surface area of the contact pad.

Figure 1:
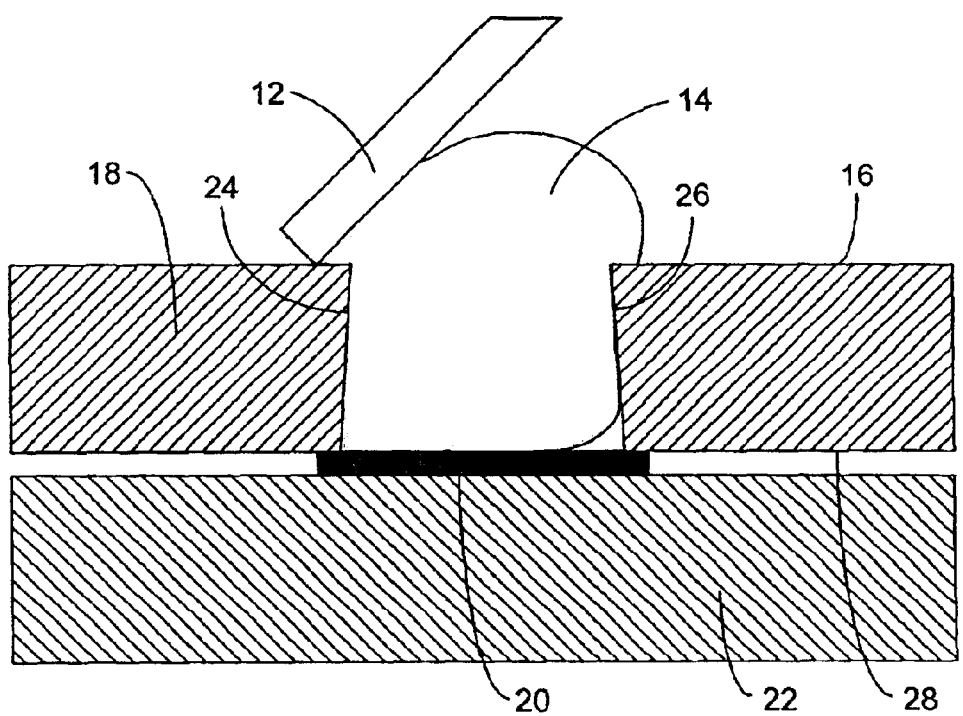
FIG. 1 is a cross-sectional illustration of a prior-art method for printing solder paste on a printed wiring board.

The foregoing and other features and advantages of the invention will be apparent from the following, more-particular description. In the accompanying drawings, like reference characters refer to the same or corresponding parts throughout the different views. The drawings are not necessarily to scale, emphasis instead being placed upon illustrating particular principles, discussed below.

DETAILED DESCRIPTION

A printed wiring board with one or more layers of interconnected conductive pathways separated by dielectric material further includes conductive contact pads on a surface of the printed wiring board. The conductive contact pads are electrically coupled with the conductive pathways and provide a surface to which electronic components to be surface mounted on the printed wiring board can be soldered. The conductive contact pads are typically formed of copper.

Solder paste is applied to the contact pads to provide an electrical and mechanical coupling between the printed wiring board and the surface-mounted electronic components. The solder paste comprises solder powder formed of, e.g., a tin/lead alloy mixed with flux. The solder powder is in the form of small spherical or irregular shapes of solder. The flux typically includes inert solids (e.g., rosin), activators, viscosity modifiers (e.g., alcohols), and other additives. The inert solids provide the solution into which the activators are dissolved and also serve as an oxygen barrier to protect the solder joint from further oxidation during the reflow process. The activators serve as cleaners that remove oxygen from the pad, lead and solder powder to prepare for reflow. Other additives are used to adjust solder paste properties such as flux surface tension or solder paste drying rate.

Figure 2:
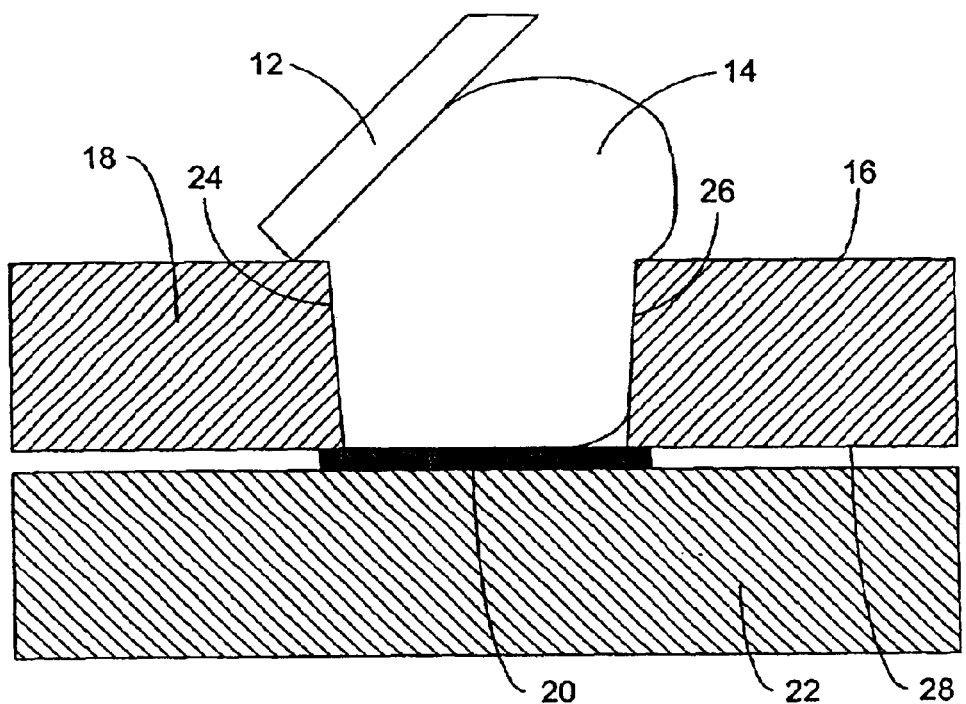
FIG. 2 is a cross-sectional illustration of a method for printing solder paste using a stencil of a design disclosed herein.

As shown in FIG. 2, the solder paste 14 is selectively applied to the contact pads 20 using a substantially planar stencil 18, which defines one or more apertures (typically, a plurality of apertures), placed on (for example, over) the printed wiring board 22. The stencil 18 can be formed of a variety of materials, including, but not limited to, steel; nickel; alloys of nickel or steel; brass; molybdenum; titanium; and plastics, such as kapton. The apertures can be shaped and positioned in a form generated by a computer-aided design matching the pattern of contact pads 20 on the surface of the printed wiring board 22.

Solder paste 14 is printed from a fill side 16 of the stencil 18 through the apertures and onto the contact pads 20 at the board side 28 of the stencil 18. Specifically, a blade 12 formed of rubber or metal can be used to push a bead of solder paste 14 across the fill side 16 of the stencil 18 until the solder paste 14 is forced into the apertures of the stencil 18. The blade 12 can be a component of a conventional squeegee, or it can be a part of a material dispensing head, as described in U.S. Pat. No. 5,947,022, which is incorporated by reference herein in its entirety. After the apertures of the stencil 18 are filled with solder paste 14, the stencil 18 is removed from the board 22, leaving the printed solder paste 14 adhered to the contact pad 20. The solder paste 14 can be maintained at room temperature and in a "paste" condition (i.e., not melted or "reflowed") throughout the printing process.

The apertures in the stencil 18 are tapered such that the cross-sectional area of each, in planes parallel to the surfaces of the stencil, increases from the board side 28 to the fill side 16 of the stencil 18. At the board side 28, the shape of the aperture can match that of the top surface of the contact pad 20, though its size is generally slightly smaller to ensure that solder paste 14 does not flow over the edge of the contact pad 20 and onto other areas of the printed wiring board 22 where the paste can result in electrical malfunction of the board 22 and/or misplaced electronic components. The cross-section of the aperture can be of any geometry (e.g., square, rectangle, circle, pentagon, oval, oblong, etc.).

The area of the aperture's cross-section can increase linearly as a function of the distance of the plane of the cross-section from the board side 28 of the stencil 18, while the general shape of the aperture remains the same through the stencil 18. The diameter or width of the aperture opening at the fill side 16 of the stencil 16 can be from just over zero to about 0.25 mm (10 mils) greater than the diameter or width of the aperture opening at the board side 28 of the stencil 18. In most applications, the stencil 18 will be from about 0.1 to about 0.2 mm (about 4 to about 8 mil) thick and, in more-particular embodiments, the thickness of the stencil is in the range of about 0.13 mm to about 0.15 mm (about 5 to about 6 mil). The width of the aperture opening (i.e., the narrowest distance across the aperture) at the board side 28 of the stencil 18 can be in the range of about 0.1 to about 0.3 mm (about 4 to about 12 mil). In many embodiments, the aspect ratio of the apertures (i.e., the ratio of the width at the board side to the thickness of the stencil) is in the range of about 1.0 to about 1.5.

In a particular embodiment, the stencil 18 has a thickness of 0.20 mm (8 mil), and the diameter of the aperture opening at the board side 28 is 0.30 mm (12 mil), while the diameter of the aperture opening at the fill side 16 is 0.33 mm (13 mil). Such a stencil 18 has an aperture volume 18% greater than an otherwise identical stencil 18 (such as the prior-art stencil illustrated in FIG. 1) where the aperture opening at the fill side 16 is 1 mil less than the 12-mil opening at the board side 28 in accordance with the conventional, acute taper.

The apertures can be formed by any of the conventional post-fabrication treatment methods, such as laser cutting, ferric chloride etching, electro-forming, etc. The apertures can then, optionally, be post-treated after fabrication by any of the conventional post-fabrication treatment methods such as electro-polishing, electroplating, coating with low-energy polymers, etc.

In one embodiment, the stencil 18 (in particular, the side walls of the apertures) is coated with a material having a surface energy lower than that of the stencil surface to reduce adhesion of the solder paste 14 to the stencil 18. The coating can be a layer of parylene, also known as poly-para-xylylene, or its homologues deposited as described in U.S. Pat. No. 5,879,808, which is incorporated herein by reference in its entirety. Reducing the surface energy of the aperture walls 24, 26 reduces the wetting (increases the contact angle) of the solder paste 14 to the walls 24, 26 and thereby facilitates release of the solder paste 14 to the contact pads 20. Other materials that can be used alternatively or in combination as a coating on the aperture walls 24, 26 of the stencil 18 include polytetrafluoroethylene (TEFLON), polyethylene, polyethylene, polypropylene, polystyrene and other materials that can be coated and that have a low surface energy. To improve adhesion of the coating, the stencil can first be micro-blasted and then cleaned in isopropyl alcohol and water. After the stencil is dried, it can be inserted into a low-pressure chamber for deposition of the coating. The deposited coating can be about 2 microns thick. Coating of aperture sidewalls by parylene is further described in a U.S. provisional patent application Serial No. 60/381,508, filed May 17, 2002, and entitled "Coated Aperture Holes in a Stencil for Solder Paste Printing", which is incorporated by reference herein in its entirety.

After the stencil 18 is removed from the surface of the board 22, leads of one or more components are embedded into the solder paste 14 adhered to the contact pads 20. The solder paste 14 is then reflowed by heating it to a temperature above the melting point of the solder alloy. Upon subsequent cooling, the solder solidifies to form a secure electrical and mechanical coupling between the contact pads and the component.

While this invention has been shown and described with references to particular embodiments thereof, those skilled in the art will understand that various changes in form and details may be made therein without departing from the scope of the invention, which is limited only by the following claims.

What is claimed is:

1. A method for printing solder paste on a conductive pad of a printed wiring board, the method comprising:
providing a printed wiring board having at least one conductive contact pad having a surface suitable for adhesion of solder paste to provide a physical and electrical coupling between the printed wiring board and an electronic component;
providing a stencil having a board side and a fill side, wherein the stencil includes sidewalls that define at least one aperture, the sidewalls being coated with parylene or its homologues and the coating having a surface energy lower than that of the stencil, the aperture extending from the board side to the fill side, the cross-section of the aperture at the board side having a profile that fits within the profile of the surface of the contact pad, and the aperture being tapered such that the area of the cross-section of the aperture at the fill side is larger than the area of the cross-section of the aperture at the board side;
placing the board side of the stencil in contact with the printed wiring board and aligning the aperture with the contact pad of the printed wiring board; and
printing solder paste, in paste form, through the aperture and onto the contact pad, the solder paste adhering to the contact pad.

2. The method of claim 1, further comprising removing the stencil, while leaving the solder paste substantially adhered to the contact pad.

3. The method of claim 2, wherein the printed solder paste adheres to the contact pad without extending over onto other areas of the circuit board.

4. The method of claim 3, wherein the amount of solder paste adhered to the contact pad is greater than could be achieved in an otherwise identical method but where (a) the cross-section of the aperture is uniform through the stencil and fits within the profile of the surface of the contact pad, or (b) the aperture is uniformly tapered such that the cross-section of the aperture gradually decreases from a size that fits within the profile of the surface of the contact pad at the board side of the stencil to a smaller cross-section at the fill side of the stencil.

5. The method of claim 2, wherein the solder paste is at about room temperature when it passes through the stencil and when the stencil is removed.

6. The method of claim 2, further comprising removing the stencil and then embedding a lead of an electronic component into the solder paste adhered to the contact pad.

7. The method of claim 6, further comprising the step of reflowing the solder paste after the lead of the electronic component is embedded into it to form a secure mechanical and electrical coupling between the electronic component and the printed wiring board.

8. The method of claim 1, wherein the aperture gradually shrinks at a substantially uniform taper from the fill side to the board side of the stencil.

9. The method of claim 1, wherein the solder paste is forced through the aperture and onto the contact pad with a squeegee.

10. The method of claim 1, wherein the solder paste is forced through the aperture and onto the contact pad with a material dispensing head.

11. The method of claim 1, wherein the stencil has a thickness in the range from about 0.1 to about 0.2 mm thick.

12. The method of claim 11, wherein the aperture has a width of about 0.1 to about 0.3 mm at the board side of the stencil.

13. The method of claim 12, wherein the dimensions of the cross-section of the aperture at the fill side of the stencil are no more than about 0.25 mm greater than the dimensions of the cross-section of the aperture at the board side of the stencil.

14. An apparatus for printing of solder paste, the apparatus comprising:
a printed wiring board comprising a plurality of conductive contact pads, the conductive contact pads positioned in a pattern on a surface of the printed wiring board and having surfaces suitable for adhesion of solder paste to provide physical and electrical couplings between the printed wiring board and one or more electronic components;
a stencil having a board side and a fill side, wherein the stencil includes sidewalls that define a plurality of apertures, the apertures extending from the board side to the fill side, the cross-section of the apertures at the board side having profiles that fit within the profiles of the surfaces of the contact pads when the board side of the stencil is placed in contact with the contact pads, and the apertures being tapered such that the area of the cross-section of the aperture at the fill side is larger than the area of the cross-section of the aperture at the board side; and
a coating including parylene or its homologues on the aperture sidewalls.

15. The apparatus of claim 14, wherein the stencil has a thickness in the range from about 0.1 to about 0.2 mm thick.

16. The apparatus of claim 15, wherein the aperture has a width of about 0.1 to about 0.3 mm at the board side of the stencil.

17. The apparatus of claim 16, wherein the dimensions of the cross-section of the aperture at the fill side of the stencil are no more than about 0.25 mm greater than the dimensions of the cross-section of the aperture at the board side of the stencil.

18. The apparatus of claim 14, wherein the coating has a surface energy lower than that of the stencil.

19. A method for printing solder paste on a conductive contact pad, the method comprising:
providing a printed wiring board having at least one conductive contact pad having a surface suitable for adhesion of solder paste to provide a physical and electrical coupling between the printed wiring board and an electronic component;
providing a stencil including sidewalls that define at least one aperture extending through the stencil, the sidewalls being coated with parylene or its homologues;
placing the stencil in contact with the printed wiring board and aligning the aperture with the contact pad of the printed wiring board; and
printing solder paste, in paste form, through the aperture and onto the contact pad, the solder paste adhering to the contact pad.

20. A coated stencil comprising:
a stencil including sidewalls that define at least one aperture extending through the stencil; and a coating including parylene or its homologues on the sidewalls.

21. The method of claim 1, wherein the stencil has a thickness of in the range from about 0.1 to about 0.2 mm, and wherein the dimensions of the aperture at the fill side are greater than, but no more than 0.25 mm greater than, the dimensions of the aperture at the board side.

* * * * *